(12) United States Patent
Werkhoven

(10) Patent No.: US 9,312,339 B2
(45) Date of Patent: Apr. 12, 2016

(54) STRAIN RELAXATION USING METAL MATERIALS AND RELATED STRUCTURES

(71) Applicant: Soitec, Crolles Cedex (FR)

(72) Inventor: Christiaan J. Werkhoven, Gilbert, AZ (US)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 14/165,471

(22) Filed: Jan. 27, 2014

(65) Prior Publication Data

US 2014/0138796 A1    May 22, 2014

Related U.S. Application Data

(62) Division of application No. 12/977,999, filed on Dec. 23, 2010, now Pat. No. 8,637,383.

(51) Int. Cl.

| | |
|---|---|
| *H01L 29/20* | (2006.01) |
| *H01L 21/18* | (2006.01) |
| *H01L 21/762* | (2006.01) |
| H01L 21/24 | (2006.01) |
| H01L 21/02 | (2006.01) |
| H01L 29/06 | (2006.01) |

(52) U.S. Cl.
CPC ...... *H01L 29/2003* (2013.01); *H01L 21/02002* (2013.01); *H01L 21/185* (2013.01); *H01L 21/76254* (2013.01); *H01L 21/02458* (2013.01); (Continued)

(58) Field of Classification Search
CPC ............... H01L 21/02002; H01L 29/2003; H01L 21/76254; H01L 21/185; H01L 21/242; H01L 21/02458; H01L 21/254; H01L 21/02488; H01L 29/0684; H01L 21/02647

USPC ............ 257/615, E21.089, E21.09, 616, 617, 257/618; 438/50, 93, 478, 479
See application file for complete search history.

(56) References Cited

U.S. PATENT DOCUMENTS

| | | |
|---|---|---|
| 5,374,564 A | 12/1994 | Bruel |
| 5,391,257 A | 2/1995 | Sullivan et al. |

(Continued)

FOREIGN PATENT DOCUMENTS

| | | |
|---|---|---|
| EP | 1052684 A1 | 11/2000 |
| EP | 1246233 A2 | 10/2002 |

(Continued)

OTHER PUBLICATIONS

Web document by Wikipedia p. 8/17 on resistivity Date Aug. 27, 2014.*

(Continued)

*Primary Examiner* — Thinh T Nguyen
(74) *Attorney, Agent, or Firm* — TraskBritt

(57) ABSTRACT

Methods of fabricating semiconductor structures include forming a plurality of openings extending through a semiconductor material and at least partially through a metal material and deforming the metal material to relax a remaining portion of the semiconductor material. The metal material may be deformed by exposing the metal material to a temperature sufficient to alter (i.e., increase) its ductility. The metal material may be formed from one or more of hafnium, zirconium, yttrium, and a metallic glass. Another semiconductor material may be deposited over the remaining portions of the semiconductor material, and a portion of the metal material may be removed from between each of the remaining portions of the semiconductor material. Semiconductor structures may be formed using such methods.

24 Claims, 6 Drawing Sheets

(52) U.S. Cl.
CPC ......... *H01L 21/02488* (2013.01); *H01L 21/242* (2013.01); *H01L 29/0684* (2013.01)

(56) References Cited

U.S. PATENT DOCUMENTS

| | | | |
|---|---|---|---|
| 5,395,769 | A | 3/1995 | Arienzo et al. |
| 5,401,544 | A | 3/1995 | Nakahata et al. |
| 5,446,330 | A | 8/1995 | Eda et al. |
| 5,448,126 | A | 9/1995 | Eda et al. |
| 5,630,949 | A | 5/1997 | Lakin |
| 5,714,395 | A | 2/1998 | Bruel |
| 5,877,070 | A | 3/1999 | Goesele et al. |
| 5,882,987 | A | 3/1999 | Srikrishnan |
| 5,966,620 | A | 10/1999 | Sakaguchi et al. |
| 5,994,207 | A | 11/1999 | Henley et al. |
| 6,010,579 | A | 1/2000 | Henley et al. |
| 6,020,252 | A | 2/2000 | Aspar et al. |
| 6,054,370 | A | 4/2000 | Doyle |
| 6,103,597 | A | 8/2000 | Aspar et al. |
| 6,107,113 | A | 8/2000 | Harmand et al. |
| 6,133,058 | A | 10/2000 | Kodoguchi et al. |
| 6,303,468 | B1 | 10/2001 | Aspar et al. |
| 6,328,796 | B1 | 12/2001 | Kub et al. |
| 6,335,258 | B1 | 1/2002 | Aspar et al. |
| 6,380,050 | B1 * | 4/2002 | Wang et al. ................. 438/478 |
| 6,562,127 | B1 | 5/2003 | Kud et al. |
| 6,744,064 | B2 | 6/2004 | Lee et al. |
| 6,756,286 | B1 | 6/2004 | Moriceau et al. |
| 6,756,289 | B1 | 6/2004 | Nakagawa et al. |
| 6,809,044 | B1 | 10/2004 | Aspar et al. |
| 6,873,012 | B2 | 3/2005 | Stecher |
| 6,946,365 | B2 | 9/2005 | Aspar et al. |
| 7,009,270 | B2 | 3/2006 | Letertre et al. |
| RE39,484 | E | 2/2007 | Bruel |
| 7,189,588 | B2 * | 3/2007 | Usui et al. ................. 438/22 |
| 7,273,798 | B2 | 9/2007 | Lester et al. |
| 7,879,732 | B2 | 2/2011 | Hu et al. |
| 8,039,869 | B2 | 10/2011 | Lester et al. |
| 8,067,298 | B2 | 11/2011 | Kononchuk |
| 2002/0068201 | A1 | 6/2002 | Vaudo et al. |
| 2002/0078881 | A1 | 6/2002 | Cuomo et al. |
| 2002/0197825 | A1 | 12/2002 | Usui et al. |
| 2003/0102473 | A1 | 6/2003 | Chason et al. |
| 2004/0048448 | A1 | 3/2004 | Koike et al. |
| 2004/0192067 | A1 | 9/2004 | Ghyselen et al. |
| 2004/0195656 | A1 | 10/2004 | Ghyselen et al. |
| 2004/0209402 | A1 | 10/2004 | Chai et al. |
| 2004/0241902 | A1 | 12/2004 | Letertre et al. |
| 2005/0003641 | A1 | 1/2005 | Faure |
| 2005/0161772 | A1 | 7/2005 | Suzuki |
| 2006/0046325 | A1 * | 3/2006 | Usui et al. ................. 438/21 |
| 2007/0072324 | A1 | 3/2007 | Krames et al. |
| 2007/0087525 | A1 | 4/2007 | Chen et al. |
| 2008/0142781 | A1 * | 6/2008 | Lee ................. 257/13 |
| 2008/0164570 | A1 * | 7/2008 | Kouvetakis ............ C30B 25/183 257/607 |
| 2008/0211061 | A1 | 9/2008 | Atwater, Jr. |
| 2008/0230802 | A1 | 9/2008 | Bakkers et al. |
| 2010/0051900 | A1 * | 3/2010 | Huffaker ................. B82Y 20/00 257/13 |
| 2010/0087049 | A1 * | 4/2010 | Kononchuk ......  H01L 21/02422 438/478 |
| 2010/0109126 | A1 * | 5/2010 | Arena ................. H01L 21/0242 257/615 |
| 2010/0176490 | A1 | 7/2010 | Letertre et al. |
| 2011/0221039 | A1 * | 9/2011 | Singh et al. ................. 257/615 |
| 2012/0049280 | A1 * | 3/2012 | Clifton et al. ................. 257/347 |
| 2012/0161289 | A1 | 6/2012 | Werkhoven |
| 2012/0280363 | A1 * | 11/2012 | Sumida ................. C30B 25/04 257/615 |

FOREIGN PATENT DOCUMENTS

| | | |
|---|---|---|
| EP | 1278233 A1 | 1/2003 |
| EP | 1385215 A2 | 1/2004 |
| EP | 1750311 A2 | 2/2007 |
| GB | 2354370 A | 3/2001 |
| JP | 2001326384 A | 11/2001 |
| JP | 2002261075 A | 9/2002 |
| JP | 2003017790 A | 1/2003 |
| JP | 2004104056 A | 4/2004 |
| JP | 2005020025 A | 1/2005 |
| JP | 2005093988 A | 4/2005 |
| JP | 2007283480 A | 11/2007 |
| JP | 2008010766 A | 1/2008 |
| JP | 2008527731 A | 7/2008 |
| WO | 0068473 A1 | 11/2000 |
| WO | 2004077553 A1 | 9/2004 |
| WO | 2005004212 A | 1/2005 |

OTHER PUBLICATIONS

Web document by Wikipedia p. 1/5 to 3/5 on thermal conductivity date Jul. 30, 2014.*
Chen et al, A Systematic Study on Group III-Nitride Thin Films with Low Temperature Deposited via MOCVD, Optical Materials, vol. 26 (2004), pp. 417-420.
Christensen, A General Measure for the Ductility of Materials, Journal of Materials Science Letters, vol. 18 (1999) pp. 1371-1373.
Feng et al., Stress Generation and Relaxation During Film Heteroepitaxy on a Compliant Substrate with a Viscoelastice Glass Interlayer, Mat. Res. Soc. Symp. Proc. vol. 696, 2002, Materials Research Society, pp. N3.19.3-N3.19.6.
French et al., Reflow of BPSG for Sensor Applications, J. Micromech. Microeng., Vo. 3 (1993), pp. 135-137.
French Opinion for French application No. 1150228 dated Oct. 27, 2011, 6 pages.
French Preliminary Search Report for French Application No. 1150228 dated Oct. 27, 2011, 3 pages.
Hansen et al., Development of a Glass-Bonded Compliant Substrate, Journal of Crystal Growth, vol. 195 (1998) pp. 144-150.
Hobart et al., Compliant Substrates: A Comparative Study of the Relaxation Mechanisms of Strained Films Bonded to High and Low Viscosity Oxides, Journal of Electronic Materials,vol. 29, No. 7, pp. 897-900, (2000).
Kraus et al., Growth and Characterization of InGaN by RF-MBE, Journal of Crystal Growth, vol. 323 (2011) pp. 72-75.
Moran et al., Kinetics of Strain Relaxation in Semiconductor Films Grown on Borosilicate Glass-Bonded Substrates, Journal of Electronic Materials, vol. 30, No. 7, 2001, pp. 802-806.
Nam et al., Lateral Epitaxy of Low Defect Density GaN Layers Via Organometallic Vapor Phase Epitaxy, Appl. Phys. Lett., vol. 71, No. 18, Nov. 3, 1997, pp. 2638-2640.
Singapore Search Report for Singapore Application No. 2009051467 dated Sep. 9, 2010, 7 pages.
Syms et al., Optimization of Borophosphosilicate Glass Compositions for Silica-on-Silicon Integrated Optical Circuits Fabricated by the Sol-Gel Process, Electronics Letters, vol. 32, No. 13, Jun. 20, 1996, pp. 1233-1234.
Yin et al., Buckling Suppression of SiGe Islands on Compliant Substrates, Journal of Applied Physics, Nov. 15, 2003, vol. 94, No. 10, pp. 6875-6882.
Yin et al., Relaxed SiGe Layers with High Ge Content by Compliant Substrates, Integration of Heterogeneous Thin-Film Materials and Devices Symposium, Mater. Res. Soc. Symposium Proceedings vol. 768, 2003, 6 pages.
Yin et al., Strain Relaxation of SiGe Islands on Compliant Oxide, Journal of Applied Physics, Jun. 15, 2003, vol. 91, No. 12, pp. 9716-9722.
Zheleva et al., Dislocation Density Reduction Via Lateral Epitaxy in Selectively Grown GaN Structures, Appl. Phys. Lett., vol. 71, No. 17, Oct. 27, 1997, pp. 2472-2474.
Zheng et al., Temperature Dependence of the Material Characterizing Ductility Factor in the New Damage Theory, International Journal of Fracture, vol. 76, 1996, pp. R77-R81.
International Search Report for International Application No. PCT/EP2011/073816 dated Apr. 4, 2012, 4 pages.
International Written Opinion for International Application No. PCT/EP2011/073816 dated Apr. 4, 2012, 6 pages.
International Preliminary Report on Patentability for International Application No. PCT/EP2011/073816 dated Jun. 25, 2013, 7 pages.

* cited by examiner

STRAIN RELAXATION USING METAL MATERIALS AND RELATED STRUCTURES

CROSS-REFERENCE TO RELATED APPLICATIONS

This application is a divisional of U.S. patent application Ser. No. 12/977,999, filed Dec. 23, 2010, now U.S. Pat. No. 8,637,383, issued Jan. 28, 2014. The subject matter of this application is related to the subject matter of U.S. patent application Ser. No. 12/576,116 to Chantal Arena, titled "METHODS OF FORMING LAYERS OF SEMICONDUCTOR MATERIAL HAVING REDUCED LATTICE STRAIN, SEMICONDUCTOR STRUCTURES, DEVICES AND ENGINEERED SUBSTRATES INCLUDING SAME," filed on Oct. 8, 2009, now U.S. Pat. No. 8,278,193, issued Oct. 2, 2012, U.S. patent application Ser. No. 12/574,142 to Oleg Kononchuk, titled "RELAXATION OF A STRAINED MATERIAL LAYER WITH APPLICATION OF A STIFFENER," filed on Oct. 6, 2009, now U.S. Pat. No. 8,067,298, issued Nov. 29, 2011, and U.S. patent application Ser. No. 12/563,953 to Letertre et al., titled "METHODS OF FORMING RELAXED LAYERS OF SEMICONDUCTOR MATERIALS, SEMICONDUCTOR STRUCTURES, DEVICES AND ENGINEERED SUBSTRATES INCLUDING SAME," filed on Sep. 21, 2009, now U.S. Pat. No. 8,486,771, issued Jul. 16, 2013, each of which is assigned to the Assignee of the present application, and the disclosure of each of which is incorporated by reference herein in its entirety.

TECHNICAL FIELD

The present invention generally relates to the fabrication of semiconductor structures or devices using engineered substrates, to intermediate structures formed during the fabrication of semiconductor structures or devices, and to engineered substrates for use in the fabrication of semiconductor structures or devices.

BACKGROUND

Substrates that include one or more semiconductor materials are used to form a wide variety of semiconductor structures and devices including, for example, integrated circuit (IC) devices (for example, logic processors and memory devices), radiation emitting devices (for example, light emitting diodes (LEDs), resonant cavity light emitting diodes (RCLEDs), vertical cavity surface emitting lasers (VCSELs)), radiation sensing devices (for example, optical sensors) and electronic devices utilized in power control systems. Such semiconductor devices are conventionally formed in a layer-by-layer manner (lithographically) on and/or in a surface of a semiconductor substrate.

Historically, a majority of such semiconductor substrates that have been used in the semiconductor device manufacturing industry have comprised thin discs or "wafers" of silicon material. Such wafers of silicon material are fabricated by first forming a large generally cylindrical silicon single crystal ingot and subsequently slicing the single crystal ingot perpendicularly to its longitudinal axis to form a plurality of silicon wafers. Such silicon wafers may have diameters as large as about thirty centimeters (30 cm) or more (about twelve inches (12 in) or more). Although silicon wafers generally have thicknesses of several hundred microns (for example, about 700 microns) or more, only a very thin layer (for example, less than about three hundred nanometers (300 nm)) of the semiconductor material on a major surface of the silicon wafer is actually used to form active devices on the silicon wafer.

It has been discovered that the operational speed and power efficiency of semiconductor devices can be improved by electrically insulating the portion of the semiconductor material on a semiconductor substrate that is actually used to form the semiconductor devices from the remaining bulk semiconductor material of the substrate. As a result, so-called "engineered substrates" have been developed that include a relatively thin semiconductor material (for example, a layer having a thickness of less than about three hundred nanometers (300 nm)) disposed on a dielectric material (for example, silicon dioxide ($SiO_2$), silicon nitride ($Si_3N_4$), or aluminum oxide ($Al_2O_3$)). Optionally, the dielectric material may be relatively thin (for example, too thin to enable handling by conventional semiconductor device manufacturing equipment), and the semiconductor material and the dielectric material may be disposed on a relatively larger host or base substrate to facilitate handling of the overall engineered substrate by manufacturing equipment. The base substrate is often referred to in the art as a "handle" or "handling" substrate.

A wide variety of engineered substrates are known in the art and may include semiconductor materials such as, for example, silicon (Si), germanium (Ge), silicon carbide (SiC), III-V type semiconductor materials, and II-VI type semiconductor materials.

For example, an engineered substrate may include an epitaxial III-V type semiconductor material formed on a surface of a base substrate, such as aluminum oxide ($Al_2O_3$) (which may be referred to as "sapphire"). Using such an engineered substrate, additional layers of material may be formed and processed (e.g., patterned) over the epitaxial III-V type semiconductor material to form one or more devices on the engineered substrate.

Due to a natural tendency of atoms of different material layers to align with one another, when a semiconductor material is formed (for example, epitaxially grown) over another material (for example, a different underlying semiconductor material), the atoms of the crystal layer tend to "strain" (i.e., stretch or compress) to align with the atoms of the lattice of the underlying material. The formation and use of strained layers of semiconductor material is limited because these strained layers may develop detrimental defects, such as dislocations, due to mismatch of the lattice parameters between adjacent materials. Depending on its particular composition, the semiconductor material may be grown only to a particular thickness, often referred to as a "critical thickness," before defects and separation of compositional phases begin to develop. The critical thickness of a material is dependent on a number of parameters, including for example, the lattice structure of the underlying material, the composition of the semiconductor material, and the growth conditions under which the semiconductor material is formed. Dislocations may form above a critical thickness when a lattice parameter mismatch exists between the semiconductor material and the underlying substrate material. When forming these layers epitaxially, both a high doping concentration and increased material thickness may be desirable to reduce electrical resistivity. However, as the concentration of dopant and the thickness of the semiconductor material are increased, preserving a crystal structure having low defect density may become increasingly difficult.

For example, indium gallium nitride ($In_xGa_{1-x}N$) devices may be formed on an engineered substrate by growing one or more epitaxial device layers each comprising indium gallium nitride on a gallium nitride (or indium gallium nitride) seed layer formed on the engineered substrate. Mismatch in the crystal lattice structures of the adjacent layers of indium gallium nitride may induce strain within the crystal lattice of one or more of the layers, which may effectively limit the thickness of the layers and/or the concentration of indium therein. Lattice strain is more problematic (e.g., in terms of obtaining good device performance) in indium gallium nitride device layers having higher indium content and increased thicknesses.

The presence of such lattice strain in a semiconductor material may be undesirable for a number of reasons. For example, the presence of lattice strain in a semiconductor material may result in an increased density of defects (e.g., lattice dislocations) in the semiconductor material, undesirable morphology at the surface of the semiconductor material, and may even result in the formation of cracks in the semiconductor material. Furthermore, the presence of lattice strain in a semiconductor material may facilitate the onset of undesirable separation of material phases within the semiconductor material.

Forming an indium gallium nitride seed layer on the surface of an engineered substrate in such a manner that the indium gallium nitride seed layer has a lattice parameter that will match that of an indium gallium nitride device layer to be formed thereover may be difficult to reach. As a result, the crystal lattice of the overlying indium gallium nitride device layer may be strained upon formation thereof when using the underlying indium gallium nitride seed.

Borophosphosilicate glass (BPSG) may be used as a compliant material to produce relaxed indium gallium nitride. For example, the indium gallium nitride may be formed over the BPSG (e.g., by a bonding process) and a viscosity (or fluidity) of the BPSG may be decreased to relax the strain of the overlying indium gallium nitride. In fabricating BPSG, a viscosity of the BPSG varies with a concentration of boron and/or phosphorous therein. For example, a temperature at which the BPSG begins to flow may be reduced by increasing the concentration of boron in the BPSG. Accordingly, the concentration of boron and/or phosphorus in BPSG may be controlled so that the BPSG flows by the proper amount at a desired temperature.

In order to determine the concentration of boron and/or phosphorus in the BPSG, a reference sample is conventionally tested with a measuring instrument utilizing X-rays or infrared rays during fabrication of indium gallium nitride device layers. However, the concentration of boron and/or phosphorus may change over time as these impurities react with water or other atmospheric compounds. As a result, it may be difficult to determine and maintain a desired concentration of boron and/or phosphorus and, thus, a consistent flow rate of BPSG during fabrication of indium gallium nitride device layers over BPSG material. In addition, the BPSG material may be an electrical insulator and therefore may substantially prevent the flow of electrons across the BPSG material. The use of such insulating BPSG materials may therefore prevent vertical current flow through engineered substrates comprising BPSG materials and thereby may limit the design and optimization of device structures formed on such engineered substrates.

BRIEF SUMMARY

In some embodiments, the present invention includes methods of fabricating semiconductor structures. The method may include forming a metal material over a III-V type semiconductor material and deforming the metal material to relax the III-V type semiconductor material.

The present invention includes additional embodiments of methods of fabricating semiconductor structures. A portion of each of a semiconductor material and a metal material overlying a substrate may be removed to form a plurality of openings. The metal material may be heated to alter its ductility. Another semiconductor material may be deposited over the remaining portions of the semiconductor material, and a portion of the metal material may be removed from between each of the remaining portions of the semiconductor material.

In yet further embodiments, the present invention includes methods of fabricating semiconductor structures. A plurality of openings may be formed extending through a semiconductor material and partially through the metal material. The semiconductor material may overlay the metal material on a substrate. The ductility of the metal material may be altered to relax a remaining portion of the semiconductor material. Another semiconductor material may be grown over the relaxed portion of the semiconductor material.

Methods of fabricating semiconductor structures may include removing a portion of each of a semiconductor material and a metal material to form a plurality of openings. The ductility of the metal material may be altered to relax the remaining portions of the semiconductor material. A sacrificial material may be formed over two or more remaining portions of the semiconductor material and a region of the metal material exposed therebetween. A portion of the sacrificial material may be removed to expose a surface of the remaining portions of the semiconductor material. Another semiconductor material may be grown laterally over the sacrificial material using the remaining portions of the semiconductor material as a seed material.

A method of forming an engineered substrate by the present invention may include forming an epitaxial III-V type semiconductor material over a metal overlying a substrate and exposing the metal to a temperature sufficient to increase a ductility thereof.

In certain embodiments of the invention, an intermediate structure may be formed during fabrication of an engineered substrate. The intermediate structure may include a III-V type semiconductor on a metal material overlying a base substrate. The metal may exhibit a ductility sufficient to provide redistribution of the metal material.

A semiconductor structure in an embodiment of the present invention may include a metal material formed over a base substrate and an at least partially relaxed III-V type semiconductor material disposed over the metal material.

BRIEF DESCRIPTION OF THE SEVERAL
VIEWS OF THE DRAWINGS

While the specification concludes with claims particularly pointing out and distinctly claiming that which is regarded as the present invention, the advantages of this invention may be more readily ascertained from the description of the invention when read in conjunction with the accompanying drawings, in which:

DETAILED DESCRIPTION

Figure 1A:
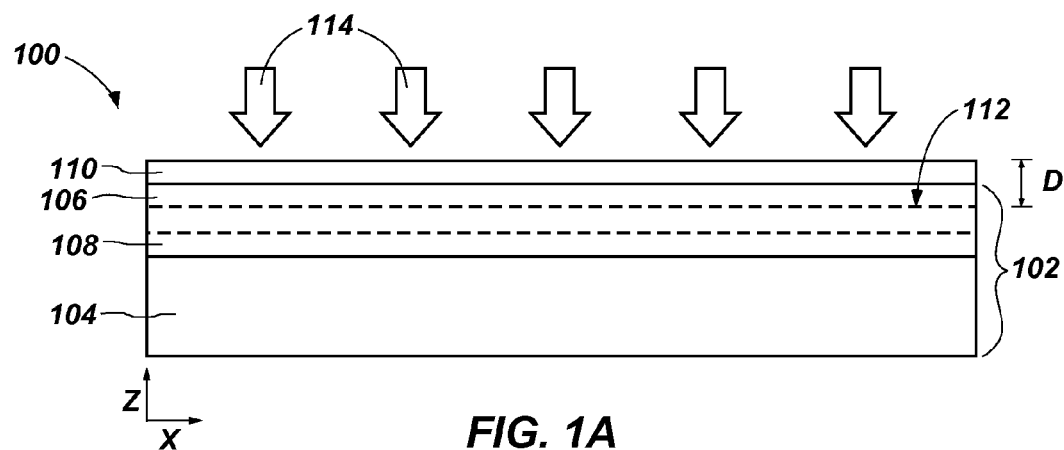
FIGS. 1A through 1F are simplified cross-sectional views of an intermediate structure that may be formed during embodiments of methods of the present invention.

The following description provides specific details, such as material types and processing conditions, in order to provide a thorough description of embodiments of the disclosure and implementation thereof. However, a person of ordinary skill in the art will understand that the embodiments of the present disclosure may be practiced without employing these specific details and in conjunction with known fabrication techniques. In addition, the description provided herein does not form a complete process flow for manufacturing a semiconductor device or system. Only those process acts and structures necessary to understand the embodiments of the disclosure are described in detail herein. The materials described herein may be formed (e.g., deposited or grown) by any suitable technique including, but not limited to, spin coating, blanket coating, chemical vapor deposition ("CVD"), plasma enhanced chemical vapor deposition ("PECVD"), atomic layer deposition ("ALD"), plasma enhanced ALD, or physical vapor deposition ("PVD"). Materials may be grown in situ. While the materials described and illustrated herein may be formed as layers, the materials are not limited to continuous layers and may be formed in other three-dimensional configurations.

As used herein, the term "semiconductor structure" means and includes any structure that is used in the formation of a semiconductor device. Semiconductor structures include, for example, dies and wafers (e.g., carrier substrates and device substrates), as well as assemblies or composite structures that include two or more dies and/or wafers three-dimensionally integrated with one another. Semiconductor structures also include fully fabricated semiconductor devices, as well as intermediate structures formed during fabrication of semiconductor devices. Semiconductor structures may comprise conductive, semiconductor and/or non-conductive materials.

As used herein, the term "bonded semiconductor structure" means and includes any structure that includes two or more semiconductor structures that are attached together. Bonded semiconductor structures are a subset of semiconductor structures, and all bonded semiconductor structures are semiconductor structures.

As used herein, the term "III-V type semiconductor material" means and includes any material predominantly comprised of one or more elements from group IIIA (group 13) of the periodic table (B, Al, Ga, In, and Tl) and one or more elements from group VA (group 15) of the periodic table (N, P, As, Sb, and Bi).

As used herein, the term "II-VI type semiconductor material" means and includes any material predominantly comprised of one or more elements from group IIB (group 12) of the periodic table (Zn, Cd, and Hg) and one or more elements from group VIA (group 16) of the periodic table (O, S, Se, Te, and Po).

As used herein, the term "critical thickness" means and includes a maximum thickness of a material above which the formation of defects, such as dislocations, within the material becomes energetically favorable.

As used herein, the term "engineered substrate" means and includes any substrate comprising two or more materials and that is intended to be used as a substrate for the fabrication of one or more semiconductor devices thereon. Engineered substrates include, for example, semiconductor-on-insulator type substrates.

As used herein, the term "epitaxial material" means and includes a material that is at least substantially a single crystal of the material and that has been formed such that the single crystal exhibits a known crystallographic orientation. The term "epitaxial layer" means a layer of epitaxial material that is at least substantially a single crystal of the material and that has been formed such that the single crystal exhibits a known crystallographic orientation.

As used herein, the term "lattice strain" means and includes a strain of the crystal lattice of a material in directions at least substantially parallel to the plane of the material and may be compressive strain or tensile strain. Similarly, the term "average lattice parameter," when used with respect to a material, means the average lattice parameter in dimensions at least substantially parallel to the plane of the material. Similarly, the term "strained" is used to indicate that the crystal lattice has been deformed (for example, stretched or compressed) from the normal spacing for such material so that its lattice spacing is different than what would normally be encountered for such material in a homogeneous relaxed crystal.

As used herein, the term "lattice constant" means and includes the distance between atoms of a unit cell measured in the plane of the surface.

Each of the terms "relax" and "relaxed," as used herein in relation to semiconductor materials, mean and include any semiconductor material that has an unstrained crystallographic structure comprising asymmetric units (such as atoms or molecules) oriented in an energetically favorable manner. The term "relaxing" means and includes changing the position of atoms in a material relative to the bulk positions so that the lattice strain within the material is at least partially relieved and the material nears or reaches its normal equilibrium lattice constant.

Embodiments of the present invention include methods and structures that facilitate the fabrication of semiconductor materials (such as, for example, epitaxial layers of III-V type semiconductor materials on engineered substrates) that have controlled and/or selected degrees of lattice strain and controlled and/or selected average lattice parameters. Example embodiments of methods of fabricating semiconductor structures or devices that include such layers of semiconductor material are described below with reference to FIGS. 1A through 4D.

Referring to FIG. 1A, a semiconductor structure 100 may be fabricated that includes a semiconductor material 110 attached to a sacrificial substrate 102. The sacrificial substrate 102 may comprise a homogenous or heterogeneous composite material such as sapphire. The semiconductor material 110, commonly referred as a donor, comprises the material in which it is desired to reduce the level of compressive or tensile strain, and that may ultimately be used as, for example, a seed material for forming one or more additional semiconductor materials thereon as part of the fabrication of an active semiconductor device.

In some embodiments, the semiconductor material 110 may comprise an epitaxial material, a single epitaxial layer, or multiple epitaxial layers of a semiconductor material. Furthermore, in some embodiments, the semiconductor material 110 may comprise an epitaxial III-V type semiconductor material. By way of non-limiting example, the semiconductor material 110 may comprise at least one of an epitaxial gallium nitride (GaN), an epitaxial indium gallium nitride ($In_xGa_{1-x}N$) and an epitaxial aluminum gallium nitride ($Al_xGa_{1-x}N$). The materials may be formed in one or more layers.

As shown in FIG. 1A, the sacrificial substrate 102 may include a base substrate 104 and one or more optional materials, including for example, an optional intermediate semiconductor material 106 and an optional dielectric material 108, that may be ultimately disposed between the semiconductor material 110 and the base substrate 104. For the sake of clarity, the thicknesses of the base substrate 104, the intermediate semiconductor material 106, the dielectric material 108 and the semiconductor material 110 are not shown to scale. The intermediate semiconductor material 106, the dielectric material 108, if present, and the semiconductor material 110 may have a thickness that is substantially less than a thickness of the base substrate 104 of the sacrificial substrate 102. The base substrate 104 may comprise, for example, a semiconductor material such as silicon (Si), germanium (Ge), silicon carbide (SiC), a III-V semiconductor material (e.g., a freestanding GaN substrate), etc. Furthermore, the base substrate 104 may comprise a single crystal of semiconductor material or one or more epitaxial layers of semiconductor material. In additional embodiments, the base substrate 104 may comprise one or more dielectric materials such as an oxide (e.g., silicon dioxide ($SiO_2$) or aluminum oxide ($Al_2O_3$)), a nitride (e.g., silicon nitride ($Si_3N_4$), boron nitride (BN) or aluminum nitride (AlN)), etc. The intermediate semiconductor material 106 may include a single semiconductor material or multiple semiconductor materials and may be used, for example, as a seed material for forming the semiconductor material 110 thereon.

The intermediate semiconductor material 106 may include one or more semiconductor materials such as, for example, a III-V type semiconductor material, and may be formed to have a thickness sufficient for epitaxial growth of additional semiconductor materials thereon. By way of non-limiting example, the intermediate semiconductor material 106 (which may comprise, for example, gallium nitride), may be formed to a thickness of between about 0.01 µm to about 100 µm, may be doped (intentionally or unintentionally) or undoped, and may be polar, semipolar, or nonpolar. The intermediate semiconductor material 106 may be grown using various methods known in the art such as, for example, hydride vapor phase epitaxy (HVPE), metal organic vapor phase epitaxy (MOVPE), and molecular beam epitaxy (MBE). Additionally, various methods may be used in forming the intermediate semiconductor material 106 to reduce the density of dislocations therein, such as epitaxial lateral overgrowth (ELO), facet-initiated epitaxial lateral overgrowth (FIELO), in-situ masking, and wafer bonding.

As another non-limiting example, the semiconductor material 110 may be bonded or attached to the sacrificial substrate 102 (without the need for optional intermediate semiconductor material 106) using techniques known in the art of integrated circuit fabrication, such as thermal bonding, thermal compression bonding, or thermal ultrasonic bonding. The semiconductor material 110 and the base substrate 104 may be bonded to one another, for example, by abutting them against one another, and maintaining them at an elevated temperature and pressure for a time sufficient to effect bonding. The temperature may be selected to impart a selected lattice parameter to the semiconductor material 110 (e.g., greater than about 100° C.). The semiconductor structure 100 may, optionally, include a dielectric material 108 overlying the base substrate 104. The dielectric material 108 may include, for example, a silicon oxynitride (e.g., SiON), a silicon nitride (e.g., $Si_3N_4$), or a silicon oxide (e.g., $SiO_2$), and may be formed using, for example, chemical vapor deposition (CVD), physical vapor deposition (PVD), or atomic layer deposition (ALD). Such a dielectric material 108 may be utilized as a bond assisting layer positioned between the semiconductor material 110 and the base substrate 104. The dielectric material 108 may be deposited over one or more of the semiconductor material 110 and the base substrate 102 prior to the attachment process.

Referring still to FIG. 1A, the semiconductor material 110 may be formed on the intermediate semiconductor material 106 using various methods known in the art. By way of non-limiting example, the semiconductor material 110 may be pseudomorphically strained indium gallium nitride formed to have a thickness less than a critical thickness thereof, for example, between about 10 nm and about 100 nm. By forming pseudomorphically strained indium gallium nitride, further relaxation through defect formation and phase separation may be inhibited. The critical thickness of the semiconductor material 110 may be determined based on variables such as chemical composition and growth conditions, which are known in the art and not described in detail herein. The polarity of the semiconductor material 110 may be inherited from the polarity of the underlying material. For example, where the semiconductor material 110 is formed over an intermediate semiconductor material 106, the semiconductor material 110 may inherit the polarity of the intermediate semiconductor material 106. The semiconductor material 110 may be formed over the intermediate semiconductor material 106 using a conventional method such as metallorganic chemical vapor deposition (MOCVD).

In some embodiments, the semiconductor material 110 may be grown or formed as m-plane or a-plane material, rather than as c-plane material. M-plane and a-plane III-nitride materials are non-polar orientations without gallium or nitrogen faces.

By way of example and not limitation, the semiconductor structure 100 may comprise a single intermediate semiconductor material 106 formed on the base substrate 104 of the sacrificial substrate 102, and the semiconductor material 110 may be formed on the intermediate semiconductor material 106. As one particular non-liming example, the intermediate semiconductor material 106 may comprise a single epitaxial layer of gallium nitride (GaN), and the semiconductor material 110 may comprise an epitaxial layer of indium gallium nitride ($In_xGa_{1-x}N$).

In some embodiments, the intermediate semiconductor material 106 may be epitaxially grown or otherwise formed over a major surface of the base substrate 104 or the dielectric material 108, if present, after which the semiconductor material 110 may be epitaxially grown or otherwise fainted over the intermediate semiconductor material 106. In other embodiments, the semiconductor material 110 may, optionally, be formed directly on the base substrate 104 without including the intermediate semiconductor material 106 or the dielectric material 108.

By way of a further example, the semiconductor structure 100 may comprise dielectric material 108 formed on the base substrate 104 and the semiconductor material 110 may be formed on the dielectric material 108 without the use of the intermediate semiconductor material 106. The semiconductor material 110 may be deposited on an additional substrate (not shown) and subsequently bonded to the dielectric material 108, followed by the removal of the additional substrate. In such embodiments the semiconductor material 110 may comprise Ga-polar ($In_xGa_{1-x}$) as-grown on the additional substrate which is subsequently inverted to N-polar ($In_xGa_{1-x}N$) upon bonding to the dielectric layer 108.

Figure 1B:
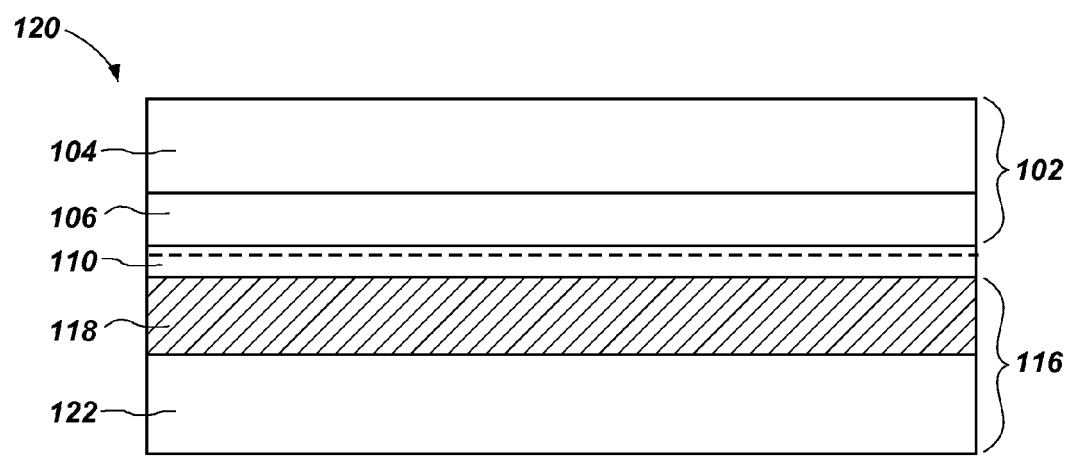

Referring to FIG. 1B, a surface of the semiconductor material 110 on a side thereof opposite the sacrificial substrate 102 may be bonded or attached to a bonding substrate 116 to form a bonded semiconductor structure 120. The bonding substrate 116 may comprise a support material 122 and a metal material 118 that is ultimately disposed between the support material 122 and the semiconductor material 110. The support material 122 may comprise a homogenous material or a heterogeneous (composite) material that provides mechanical support for the overlying metal material 118. In some embodiments, the support material 122 may comprise a material having the same or substantially similar thermal characteristics as the base substrate 104. By way of non-limiting example, the support material 122 may comprise sapphire, silicon, silicon carbide (SiC), a III-V type material (e.g., a III-arsenide), quartz ($SiO_2$), or fused silica ($SiO_2$) glass. In some embodiments of the invention, the support material 122 may be electrically and thermally conductive. For example, the support material 122 may comprise a doped (intentionally or unintentionally) semiconductor substrate or a conductive metallic substrate.

The bonding substrate 116 may include, for example, one or more device structures (not shown), which may include conductive and/or nonconductive elements embedded therein. The device structures may include metal oxide semiconductor (MOS) transistors, bipolar transistors, field effect transistors (FETs), diodes, resistors, thyristors, rectifiers, and the like. The device structures may also comprise conductive lines, traces, vias, and pads that may be formed from, for example, one or more metals such as copper (Cu), aluminum (Al) or tungsten (W). The device structures may also comprise one or more through wafer interconnects (not shown). The through wafer interconnects may be formed by depositing a conductive material, such as copper (Cu), aluminum (Al), tungsten (W), polycrystalline silicon, or gold (Au), in a via hole. For example, the through wafer interconnects may extend from the semiconductor material 110 and through at least a portion of the bonding substrate 116.

The metal material 118 may be used to facilitate bonding of the bonding substrate 116 to the semiconductor material 110 and may be formed from a ductile metal, metal alloy, or metallic glass.

The metal material 118 may be selected to comprise a material that exhibits one or more desirable properties in or over a range of temperatures extending from about room temperature to about 1,200° C.

For example, in some embodiments, the metal material 118 may comprise a material that, when tested in its bulk state in accordance with conventional uniaxial tension and compression tests, exhibits a ductility β defined by Equation 1 below, which quantitative measurement of the ductility of materials is discussed more fully in R. M. Christensen, *A General Measure for the Ductility of Materials*, J. Materials Science Letters 18 (1999) pp. 1371-73, which is incorporated herein in its entirety by this reference.

$$\beta = \frac{\sigma_{1_i}^T}{|\sigma_{1_i}^C|} \quad \text{Equation 1}$$

In Equation 1, $\sigma_{1_i}^T$ is the yield level for uniaxial tension and $\sigma_{1_i}^C$ is the yield level for uniaxial compression. In some embodiments of the invention, the metal material 118 may comprise a metal material that exhibits a ductility β of greater than 0.50. More particularly, the metal material 118 may comprise a metal material that exhibits a ductility β of about 0.90 or more, or even about 0.95 or more.

The metal material 118 may comprise a material that exhibits a yield strength of about 400 megapascals (MPa) or less, or even about 300 megapascals (MPa) or less, when tested in accordance with ASTM (American Society for Testing and Materials) International Standard E21-09 (entitled "Standard Test Methods for Elevated Temperature Tension Tests of Metallic Materials") at a temperature of about 1,000° C. or less. The metal material 118 may comprise a material that exhibit a bulk modulus of about 150 gigapascals (GPa) or less, or even about 110 gigapascals (GPa) or less, when tested in accordance with ASTM International Standard E8/E8M-09 (entitled "Standard Test Methods for Tension Testing of Metallic Materials") at a temperature of about 1,000° C. or less. In some embodiments, the metal material 118 exhibit an electrical resistivity of less than about 50 micro ohm centimeters (μΩcm) or more. The metal material 118 may exhibit a thermal conductivity of about 15 $Wm^{-1}K^{-1}$ or more, or even about 20 $Wm^{-1}K^{-1}$ or more.

As non-limiting example embodiments, the metal material 118 may comprise a refractory metal and may comprise at least one of hafnium, zirconium, yttrium, and alloys of one or more such metals.

In comparison to conventional silicate glass materials, such as BPSG, the metal material 118 may enable bonding of semiconductor material 110 to the bonding substrate 116 without further processing to increase surface flatness.

The metal material 118 may facilitate bonding between semiconductor materials without the drawback of contamination by impurities (e.g., boron and phosphorous) and compositional control associated with glass materials, such as borophosphosilicate glass (BPSG). Since the metal material 118 does not include impurities and is not affected by impurities in the atmosphere or surrounding materials, the composition of the metal material 118 may be selected based on material properties, such as, conductivity and ductility.

Furthermore, the presence of impurities in glass materials, such as BPSG, may interfere with or prevent epitaxial growth of semiconductor materials with desired properties. The metal material 118 may not include such impurities that interfere with the epitaxial growth process and, thus, using the metal material 118 for bonding may provide improved growth of semiconductor materials.

The ductility of the metal material 118 may enable bonding between materials (i.e., the semiconductor material 110 and the support material 122) with mismatched crystal lattices and different coefficients of thermal expansion (CTEs). For example, the metal material 118 may plastically deform to match contours of the semiconductor material 110 and/or the support material 122. In comparison to a glass material, such as BPSG, the metal material 118 may facilitate bonding of materials (i.e., the semiconductor material 110 and the support material 122) having a greater difference between their CTEs. Use of the metal material 118 may, therefore, substantially reduce or eliminate CTE matching requirements between semiconductor material 110 and support material 122.

By way of non-limiting example, the bonding substrate 116 and the semiconductor material 110 may be bonded together by abutting them against one another, and maintaining them at an elevated temperature and pressure for a sufficient amount of time. The temperature may be selected to impart a selected lattice parameter to the semiconductor material 110 (e.g., greater than about 100° C.).

In embodiments in which the semiconductor material 110 comprises an epitaxial indium gallium nitride ($In_xGa_{1-x}$) and the intermediate semiconductor material 106 comprises gallium nitride (GaN), the bonding substrate 116 may be bonded to the indium gallium nitride at a temperature of, for example, about 800° C., to cause the pseudomorphically strained indium gallium nitride to be stretched such that its average lattice parameter is at least substantially equal to its unstrained average lattice parameter.

Figure 1C:
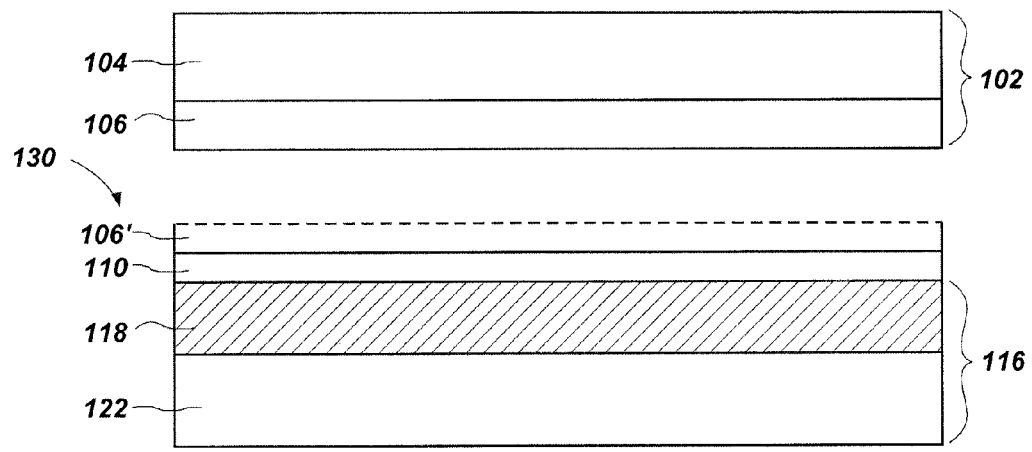

As shown in FIG. 1C, after bonding the semiconductor material 110 to the bonding substrate 116, the semiconductor material 110, together with the bonding substrate 116 may be separated from the sacrificial substrate 102 (or the sacrificial substrate 102 may be separated from the semiconductor material 110). Optionally, a portion of the intermediate semiconductor material 106', together with the semiconductor material 110 and the bonding substrate 116, may be separated from the base substrate 104. Separation of the sacrificial substrate 102 from the portion of the intermediate semiconductor material 106', or separation of the sacrificial substrate 102 from the semiconductor material 110, may be performed by various chemical, thermal, or mechanical processes, such as by a grinding process, an etching process, a polishing process, or a laser lift-off process. The method may be performed to remove the entire semiconductor material 110 from the sacrificial substrate 102, or only a portion thereof. In embodiments utilizing the sacrificial substrate 102 of FIG. 1B, semiconductor material 110 may be separated or detached from base substrate 104 by elimination of base substrate 104 employing, for example, etching, grinding, or laser irradiation through the base substrate 104 and detachment at the level of the dielectric material 108 (FIG. 1A).

By way of example and not limitation, the process known in the industry as the SMART CUT® process may be used to separate the base substrate 104 and, optionally, the intermediate semiconductor material 106, from the semiconductor material 110. Such processes are described in detail in U.S. Pat. No. RE39,484 to Bruel, U.S. Pat. No. 6,303,468 to Aspar et al., U.S. Pat. No. 6,335,258 to Aspar et al., U.S. Pat. No. 6,756,286 to Moriceau et al., U.S. Pat. No. 6,809,044 to Aspar et al., and U.S. Pat. No. 6,946,365 to Aspar et al., the disclosures of each of which are incorporated herein in their entirety by this reference.

Referring again to FIG. 1A, a plurality of ions (for example, one or more of hydrogen, helium and inert gas ions) may be implanted into the semiconductor structure 100. For example, ions may be implanted into the semiconductor structure 100 from an ion source (not shown) positioned on a side of the semiconductor structure 100 adjacent the semiconductor material 110. As represented by directional arrows 114 shown in FIG. 1A, ions may be implanted into the semiconductor structure 100 along a direction substantially perpendicular to a generally flat, major surface (that is, in a direction parallel to a Z axis) of semiconductor material 110. As known in the art, the depth at which the ions are implanted into the semiconductor structure 100 is at least partially a function of the energy with which the ions are implanted into the semiconductor structure 100. Generally, ions implanted with less energy will be implanted at relatively shallower depths, while ions implanted with higher energy will be implanted at relatively deeper depths.

As a non-limiting example, ions may be implanted into the semiconductor structure 100 with a predetermined energy selected to implant the ions at a desired depth D within the semiconductor structure 100. As known in the art, inevitably at least some ions may be implanted at depths other than the desired implantation depth, and a graph of the concentration of the ions as a function of depth into the intermediate structure 100 from the exposed surface of the semiconductor material 110 may exhibit a generally bell-shaped (symmetric or asymmetric) curve having a maximum at the desired implantation depth.

Upon implantation into the semiconductor structure 100, the ions may define an ion implant layer 112 within the semiconductor structure 100. The ion implant layer 112 may comprise a layer or region within the semiconductor structure 100 that is aligned with (for example, centered about) the plane of maximum ion concentration within the intermediate structure 100. The ion implant layer 112 may define a zone of weakness within the semiconductor structure 100 along which the semiconductor structure 100 may be cleaved or fractured in a subsequent process, as described in further detail below.

In some embodiments of the invention, the ion implant layer 112 may be disposed in one or both of the semiconductor material 110 and the intermediate layer semiconductor material 106. In other words, the ion implant layer 112 may be disposed entirely within the semiconductor material 110, or may be disposed entirely within the intermediate semiconductor material 106 (as shown in FIG. 1A) or partially within the semiconductor material 110 and partially within the intermediate semiconductor material 106 (not shown). As one particular non-limiting example, in some embodiments, the ion implant layer 112 may extend into the semiconductor material 110 at a depth between about 100 nm and about 300 nm. In additional embodiments, the ion implant layer 112 may extend into the intermediate semiconductor material 106.

Referring again to FIG. 1C, after attaching the bonding substrate 116 to the semiconductor material 110 on a side thereof opposite the base substrate 102 to form the bonded semiconductor structure 120, as previously described with reference to FIG. 1B, the bonded semiconductor structure 120 may be subjected to further processes, such as a thermal treatment process to cause the bonded semiconductor structure 120 to cleave or fracture along the ion implant layer 112. In other words, the semiconductor material 110 and, optionally, a portion of the underlying intermediate semiconductor material 106 may be delaminated from the remaining portion of the intermediate semiconductor material 106 and the underlying base substrate 104 upon thermally treating the bonded semiconductor structure 120 (FIG. 1B). Subsequent processes may be utilized to remove the portion 106' of the underlying intermediate semiconductor material 106 remaining upon semiconductor structure 130 (FIG. 1C), if so desired.

The ductility of the metal material 118 may be altered to cause the relaxation of the semiconductor material 110, forming relaxed (or partially relaxed) semiconductor material 110. By way of non-limiting example, the semiconductor structure 130 (FIG. 1C) and particularly the metal material 118 may be heated using, for example, an oven, furnace, or deposition reactor to a temperature sufficient to increase the ductility thereof so that deformation (e.g., plastic deformation) begins to occur in the metal material 118. In some embodiments, the metal material 118 may be heated to a temperature sufficient to decrease a yield strength thereof to a level at or below a stress level present within the metal material 118, such that the metal material 118 yields and plastically deforms to allow relaxation of the semiconductor material 110. A suitable temperature may be determined based on the composition of the metal material 118 and the desired increase in ductility. Heating the semiconductor structure 130 to a temperature sufficient to deform the metal material 118 relaxes or partially relaxes the overlying semiconductor material 110 (FIG. 1C)

to form relaxed (or partially relaxed) semiconductor material 110 having decreased lattice strain.

The metal material 118 and the support material 122 may exhibit thermal and electrical conductivity and, thus, may facilitate integration of the semiconductor structure 130, shown in FIG. 1C, with one or more processed semiconductor structures to form vertical, vertically stacked and three dimensional devices, such as vertical light emitting diodes (LEDs) and vertical power devices. For example, the metal material 118 the support material 122 may be used as an electrical contact for a semiconductor device formed using the semiconductor material 110.

Figure 1D:
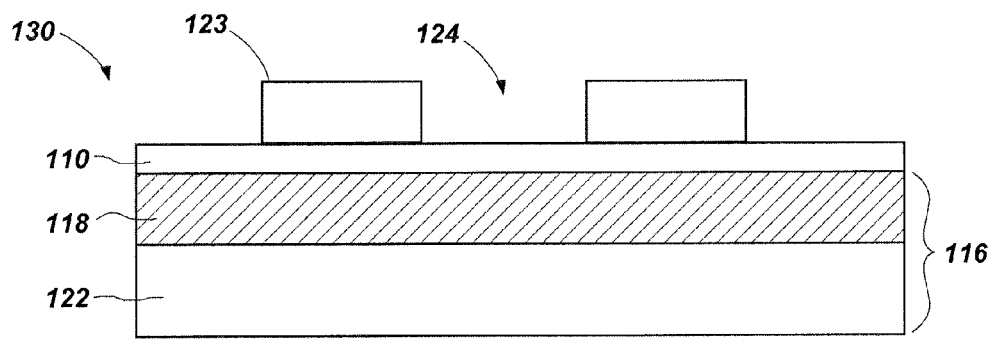

In some embodiments of the invention, the semiconductor material 110 may be processed to form island structures prior to promoting relaxation in the remaining portion of the semiconductor material 110. For example, as shown in FIG. 1D, a mask material 123 may be formed and processed (for example, patterned) over the semiconductor material 110 and, optionally, in some embodiments, the intermediate semiconductor material 106 or the dielectric material 108 (FIG. 1A), if present. The mask material 123 may be selected based on a desired etch depth and resistance with respect to underlying materials, such as the semiconductor material 110, the metal material 118, and optionally the intermediate semiconductor material 106. As a non-limiting example, the mask material 123 may comprise a photoresist material or a hardmask material, such as an oxide material, a nitride material, or a metal material (for example, chromium or titanium). A plurality of apertures 124, each exposing a surface of the semiconductor material 110, may then be formed by patterning the mask material 123 using methods known in the art.

Figure 1E:
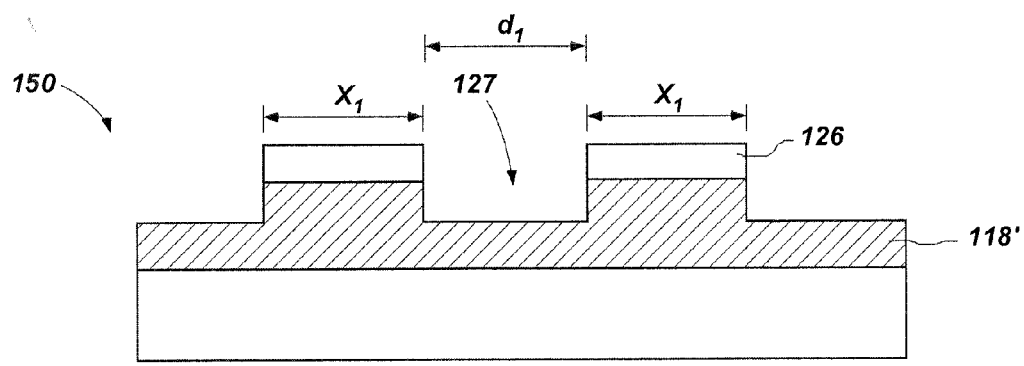

As shown in FIG. 1E, a portion of the semiconductor material 110 and a remaining portion of the metal material 118' may be removed through the apertures 124 in the mask material 123 using, for example, an anisotropic reactive ion (plasma) etching process, such as an inductively coupled plasma (ICP) etching process, or an isotropic etching process, such as a wet etching process, to form structures 126 protruding between openings 127. One or more of the openings 127 may extend partially into the remaining portion of the metal material 118'. As a non-limiting example, the semiconductor material 110 may be indium gallium nitride, the remaining portion of the metal material 118' may be a compliant metal such as zirconium, hafnium, or an alloy based on at least one of zirconium and hafnium, and the mask material 123 may be a photoresist. A chlorine-containing plasma may be used to form the openings 127. After formation of the openings 127 extending through the structures 126 and, optionally, into the remaining portion of the metal material 118', the mask material 123 may be removed from the semiconductor structure 130.

Each of the structures 126 may comprise a portion of the semiconductor material 110 and a portion of the metal material 118'. Each of the structures 126 may be formed to have a lateral dimension $X_1$ of between about 5 μm to about 1 mm, and may be spaced apart from adjacent structures 126 by a distance $d_1$ of between about 1 μm and 100 μm. The structures 126 may be characterized as islands, separated from other structures 126 by a distance $d_1$.

Figure 1F:
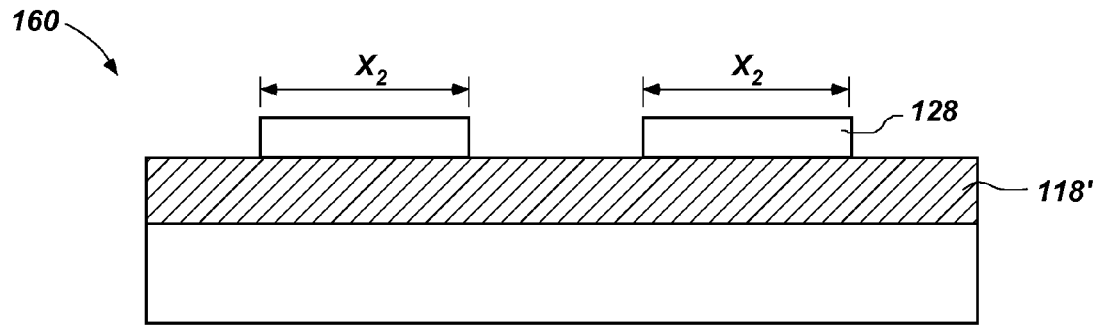

The ductility of the remaining portion of the metal material 118' may be altered to cause the relaxation of the structures 126, shown in FIG. 1E, forming relaxed (or partially relaxed) structures 128, shown in FIG. 1F. By way of non-limiting example, the remaining portion of the metal material 118' may be heated using, for example, an oven, furnace, or deposition reactor to a temperature sufficient to increase the ductility thereof so that deformation (e.g., plastic deformation) begins to occur in the metal material 118'. In some embodiments, the remaining portion of the metal material 118' may be heated to a temperature sufficient to decrease a yield strength thereof to a level at or below a stress level present within the metal material 118', such that the metal material 118' yields and plastically deforms to allow relaxation of the structures 126. A suitable temperature may be determined based on the composition of the portion of the metal material 118' and the desired increase in ductility. Heating the semiconductor structure 150 (shown in FIG. 1E) to a temperature sufficient to deform the portion of metal material 118' relaxes or partially relaxes the overlying structures 126 of semiconductor material (shown in FIG. 1E) to form relaxed (or partially relaxed) structures 128 having decreased lattice strain and may at least partially redistribute the portion of metal material 118' to form a substantially planar layer like that shown in FIG. 1F, although the metal material 118' may not deform to the extent of forming a conductive layer in additional embodiments.

Figure 1G:
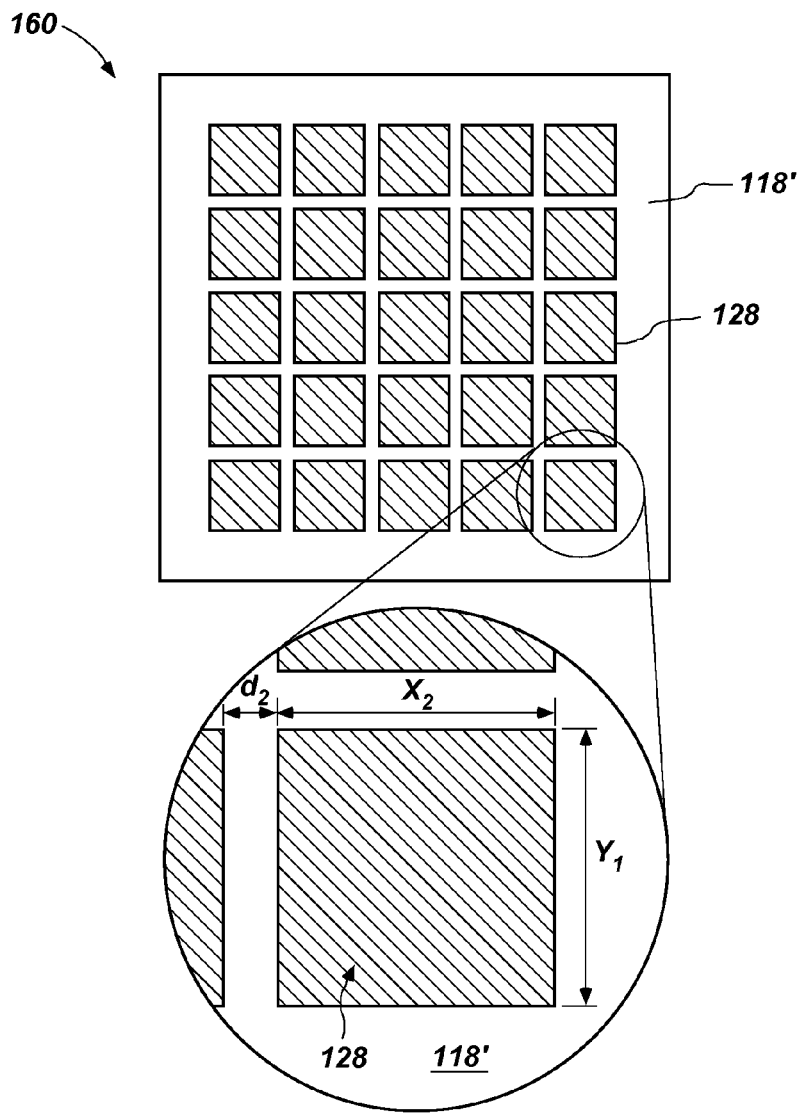
FIG. 1G is a plan view of the intermediate structure shown in FIG. 1F.

FIG. 1G is a top-down plan view of the semiconductor structure 160 shown in FIG. 1F. During deformation of the portion of compliant material 118', the relaxation process may progress from the peripheral regions to the center regions of the structures, which may result in expansion or contraction of relaxed (or partially relaxed) structures 128. Altering the ductility of the portion of metal material 118' may lead to reorganization of the atoms within the semiconductor material, forming a plurality of relaxed (or partially relaxed) structures 128 having a lateral dimension $X_2$ greater than a lateral dimension $X_1$ of the structures 126 of semiconductor material (FIG. 1E). The relaxed (or partially relaxed) structures 128 may be separated from one another by a distance $d_2$ that may be less than the distance $d_1$ between the structures 126 prior to relaxation (FIG. 1E). The relaxed (or partially relaxed) structures 128 may be islands, separated from other relaxed (or partially relaxed) structures 128 by a distance $d_2$. In embodiments in which the structures 128 are formed from indium gallium nitride, the indium gallium nitride may expand during deformation of the portion of compliant material 118' such that the compressive stress in the indium gallium nitride is reduced. In embodiments in which the structures 128 are formed from aluminum gallium nitride, the aluminum gallium nitride may contract during deformation of the portion of compliant material 118' such that the tensile stress in the aluminum gallium nitride is reduced.

Thus, the relaxed (or partially relaxed) structures 128 may exhibit substantially reduced or eliminated compressive or tensile lattice strain in comparison to a layer of the semiconductor material 110 (FIG. 1A). As a non-limiting example, each of the relaxed (or partially relaxed) structures 128 may have a lateral dimension (that is, a width or a length) $X_2$ of between about 10 μm and about 1000 μm and may be spaced apart from adjacent relaxed (or partially relaxed) structures 128 by a distance $d_2$ of between about 0.5 μm and about 20 μm. The dimensions and spacing of the relaxed (or partially relaxed) structures 128 may be selected to correspond to the desired size of the semiconductor structure or device being fabricated. By way of non-limiting example, for fabrication of light emitting diodes, the diode size (that is, the die size) may be about 1000 μm in width and 1000 μm in length. Similarly, dimensions of the structures may be designed to correspond to the width and length of the desired cavity structure for laser diode fabrication. For simplicity, the structures 128 are shown as having a substantially uniform square shape in FIG. 1G. However, the structures 128 may be of any shape and size selected to enable efficient fabrication of the structures 128, efficient use of space on the semiconductor structure 160, or optimization of any other processing variable.

Figure 2A:
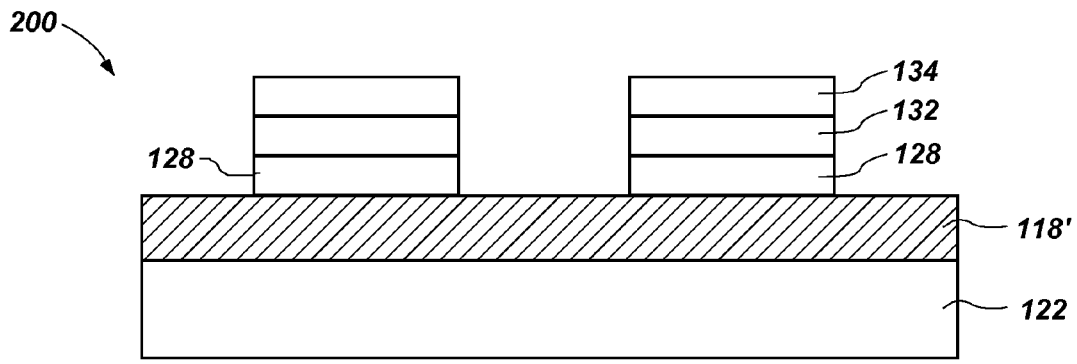
FIGS. 2A through 2C are simplified cross-sectional views of an intermediate structure that may be formed during embodiments of methods of the present invention.

Another embodiment of a method that may be used to form semiconductor structures including relaxed (or partially relaxed) semiconductor materials is described with reference to FIGS. 2A through 2C. Referring to FIG. 2A, a semiconductor structure 200 may be formed by forming another semiconductor material 132 and a mask material 134 over the relaxed (or partially relaxed) structures 128 comprising a semiconductor material overlying the metal material 118', such as that previously described with reference to FIG. 1G. In some embodiments, the another semiconductor material 132 may be formed from materials selected to ineffectively deposit on the metal material 118'. Such selection may prevent deposition of the semiconductor material 132 on the metal material 118'.

Figure 2B:
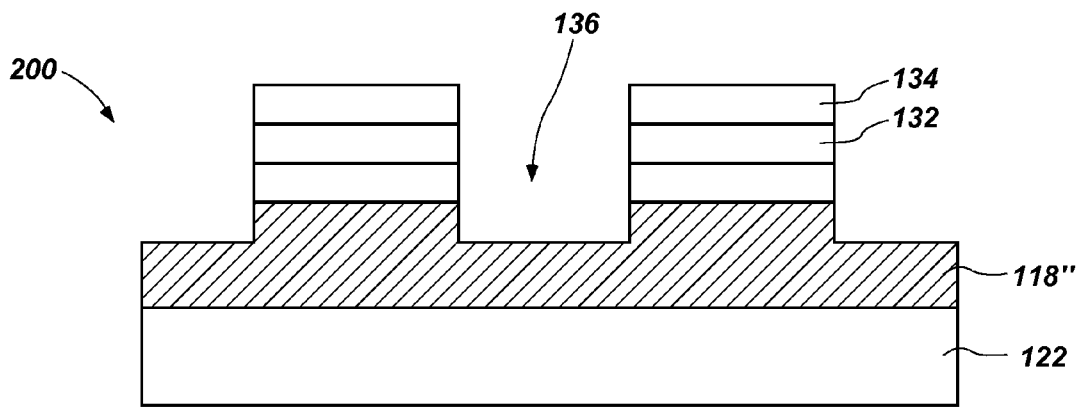
Figure 2C:
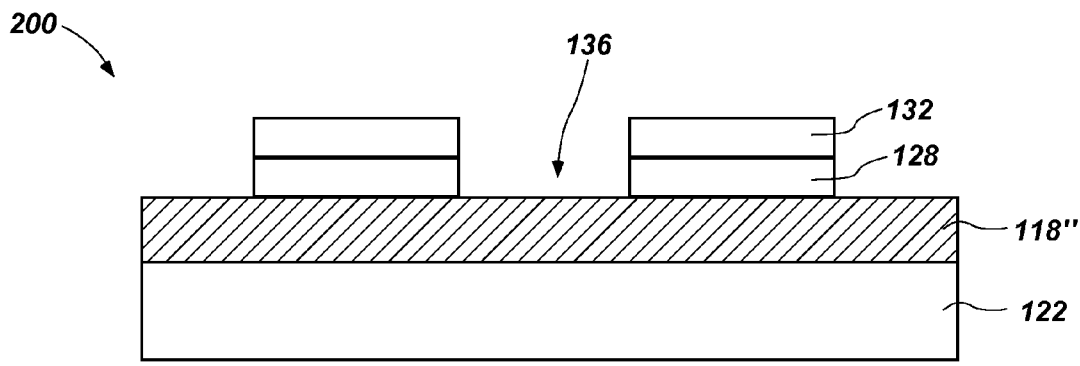

As shown in FIG. 2B, openings 136 extending at least partially into the remaining portion of the metal material 118" may be formed by removing a portion of the metal material 118', shown in FIG. 2A, with respect to the mask material 134 and, optionally, the relaxed (or partially relaxed) structures 128 and the another semiconductor material 132. The openings 136 may be formed using a wet etching process or a dry etching process. Referring to FIG. 2C, the ductility of the metal material 118" may be increased (that is, the metal material 118" may be deformed) to cause the overlying relaxed (or partially relaxed) structure 128 and the another semiconductor material 132 to relax to a degree. The ductility of the metal material 118" may be changed by exposing the semiconductor structure 200 to a sufficient temperature to cause the metal material 118" to deform. For example, the metal material 118" may be deformed by heating to a temperature at which a yield strength thereof is lower than a stress level present within the metal material 118", and may be maintained at this temperature until partial relaxation of the relaxed (or partially relaxed) structures 128 and the another semiconductor material 132 is achieved. As a non-limiting example, the conductive material 118" may include at least one of zirconium, hafnium, and an alloy based on at least one of zirconium and hafnium, and the semiconductor structure 200 may be heated to a temperature of at least about 400° C. such that the conductive material 118" exhibits a desired ductility. If the relaxed (or partially relaxed) structure 128 includes indium gallium nitride, $In_{0.08}Ga_{0.92}N$, and the another semiconductor material 132 includes indium gallium nitride, $In_{0.13}Ga_{0.87}N$, increasing the temperature of the metal material 118" (e.g., by heating the metal material 118" to a temperature at which a yield stress of the metal material 118" is equal to or less than a stress present within the metal material 118") may deform the metal material 118" and relieve lattice strain. The method described with respect to FIGS. 2A through 2C may be repeated multiple times in order to form multiple layers of semiconductor material. The metal material 118" may be formed to have a thickness predetermined to facilitate removal thereof during the repetition. By repeating the method described with reference to FIGS. 2A through 2C, a relaxed (or partially relaxed) indium gallium nitride layer having increased indium content may be formed.

Figure 3A:
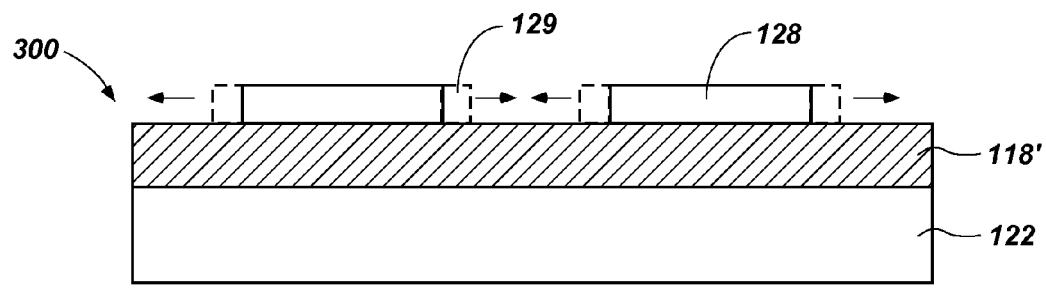
FIGS. 3A through 3C are simplified cross-sectional views of an intermediate structure that may be formed during embodiments of methods of the present invention.

Another embodiment of a method that may be used to form semiconductor structures having relaxed (or partially relaxed) semiconductor materials is described below with reference to FIGS. 3A through 3C. Referring to FIG. 3A, a semiconductor structure 300 may be provided that includes a support substrate 122, a metal material 118', and one or more relaxed (or partially relaxed) structures 128 such as described with respect to FIG. 1G. As a non-limiting example, each of the relaxed (or partially relaxed) structures 128 may include indium gallium nitride, $In_{0.08}Ga_{0.92}N$, the metal material 118' may include zirconium, hafnium, or an alloy based on at least one of zirconium and hafnium, and the support substrate 122 may include sapphire.

Each of the relaxed (or partially relaxed) structures 128 may include a semiconductor material and may be laterally extended, as shown in broken lines, by growing the semiconductor material using a growth process, such as epitaxial lateral overgrowth (ELO). For example, methods of performing lateral growth of a semiconductor material, such as a III-nitride material, are disclosed in the publications *Lateral Epitaxy of Low Defect Density GaN Layers Via Organometallic Vapor Phase Epitaxy* to Nam et al., Appl. Phys. Lett. Vol. 71, No. 18, Nov. 3, 1997, pp. 2638-40, and *Dislocation Density Reduction Via Lateral Epitaxy in Selectively Grown GaN Structures* to Zheleva et al., Appl. Phys. Lett., Vol. 71, No. 17, Oct. 27, 1997, pp. 2472-74, the disclosure of each of which is incorporated herein in its entirety by this reference. The general lateral growth of the relaxed (or partially relaxed) structures 128 is represented in FIG. 3A by directional arrows.

The lateral growth process may be performed at a temperature sufficient to alter the ductility of the underlying metal material 118', which may facilitate further relaxation of the semiconductor material in the relaxed (or partially relaxed) structures 128 as well as the laterally grown semiconductor material 129 (shown in broken lines). By way of non-limiting example, the relaxed (or partially relaxed) structures 128 may include indium gallium nitride, which may act as a seed material, facilitating the lateral growth of indium gallium nitride. As the laterally grown semiconductor material 129 forms, it may adopt the lattice structure of the relaxed (or partially relaxed) structures 128.

Figure 3B:
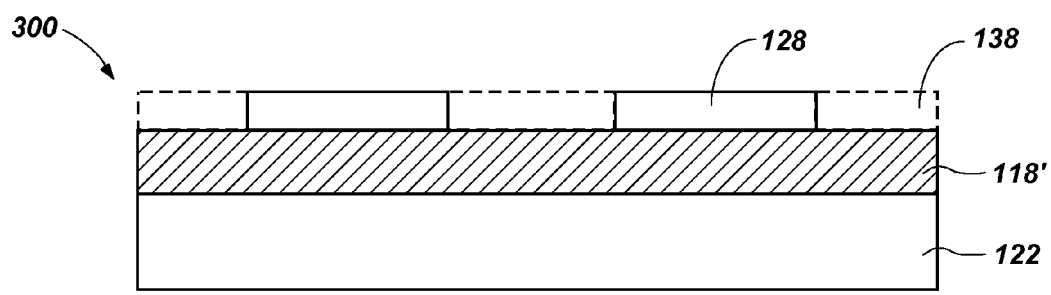
Figure 3C:
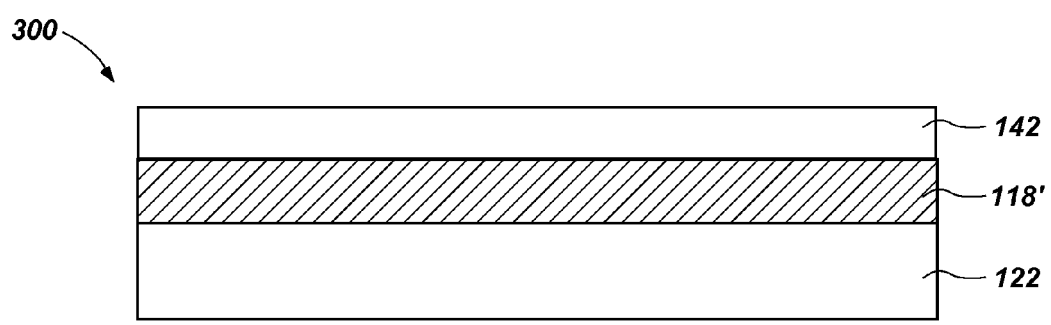

As shown in FIG. 3B, the laterally grown semiconductor material 129 may be grown until the relaxed (or partially relaxed) structures 128 coalesce to form a continuous semiconductor material 138, which is shown in broken lines, after which the growth conditions may be altered so that the continuous semiconductor material 138 may be vertically extended to a desired thickness to form a relaxed (or partially relaxed) semiconductor material 142, as shown in FIG. 3C. In some embodiments, the relaxed (or partially relaxed) semiconductor material 142 may be formed by vertically growing semiconductor material using a conventional process such as hydride vapor phase epitaxy (HVPE), metalorganic vapor phase epitaxy (MOVPE), or molecular beam epitaxy (MBE), while the metal material 118' is deformed to further relax the relaxed (or partially relaxed) semiconductor material 142. The relaxed (or partially relaxed) semiconductor material 142 may be formed having a lattice structure the same as or substantially similar to the relaxed (or partially relaxed) structures 128 (shown in FIG. 3A).

Figure 4A:
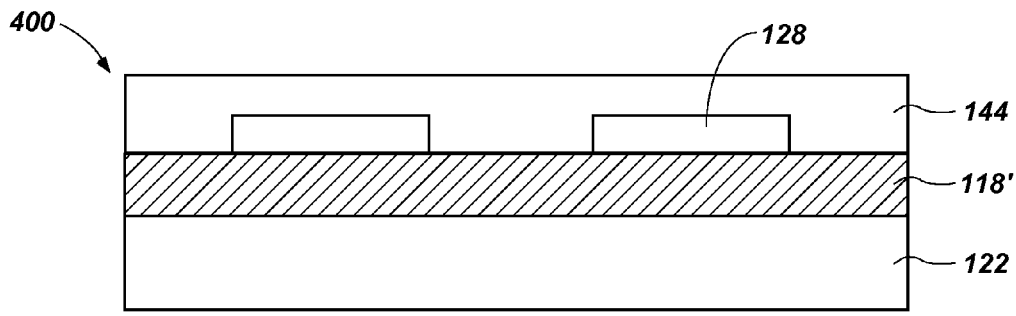
FIGS. 4A through 4D are simplified cross-sectional views of an intermediate structure that may be formed during embodiments of methods of the present invention.

Another embodiment of a method that may be used to form semiconductor structures including relaxed (or partially relaxed) semiconductor materials is described with reference to FIGS. 4A through 4D. Referring to FIG. 4A, a semiconductor structure 400 may be provided that includes relaxed (or partially relaxed) structures 128 disposed on a metal material 118' overlying a support substrate 122, such as that previously described with reference to FIG. 1G. An anti-surfactant material 144 may be formed over the metal material 118' and the support material 122. As a non-limiting example, the relaxed (or partially relaxed) structures 128 may comprise a nitrogen-containing III-V type semiconductor material and the anti-surfactant material 144 may include a material on which III-nitrides do not readily nucleate, such as silicon dioxides, silicon nitrides, and mixtures thereof.

Figure 4B:
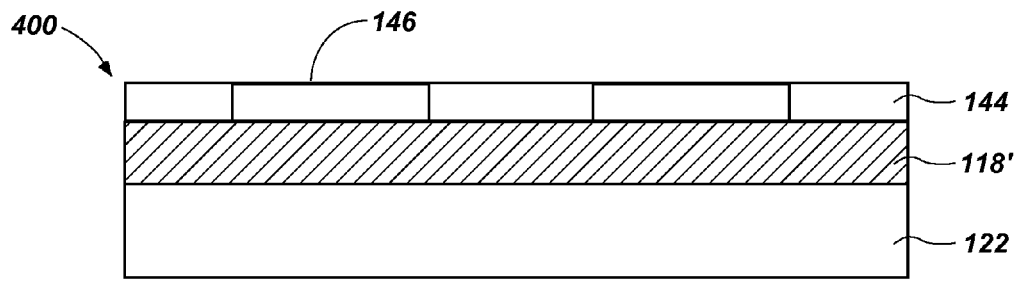

Referring to FIG. 4B, a portion of the anti-surfactant material 144 may be removed using a reactive ion etching (RIE) process or a chemical-mechanical planarization (CMP) process to expose a surface 146 of the relaxed (or partially relaxed) structures 128 through the anti-surfactant material 144.

Figure 4C:
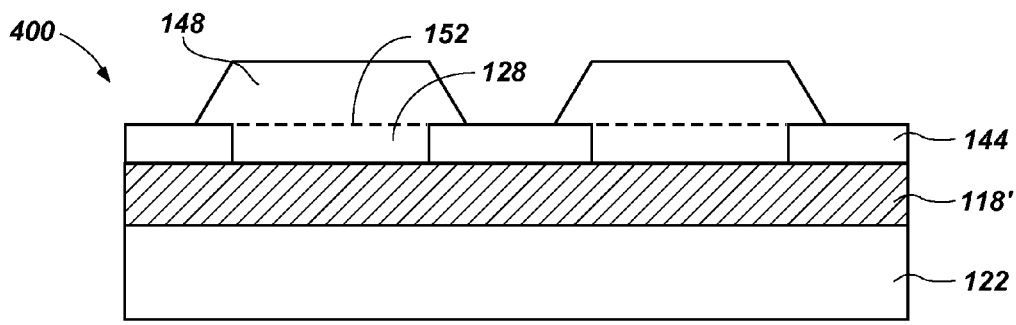
Figure 4D:
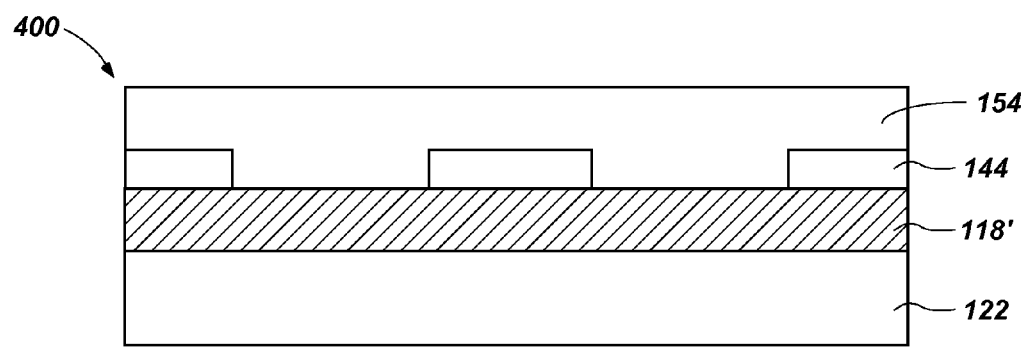

As shown in FIG. 4C, a semiconductor material 148 may be formed on the semiconductor structure 400 by a process, such as ELO, using surfaces 152 of the relaxed (or partially relaxed) structures 128, which are represented by broken lines, as a seed material. The semiconductor material 148 may adopt a lattice structure of the relaxed structures 128 and, thus, may be grown to form a relaxed semiconductor material 154. The relaxed semiconductor material 154 may be grown to form a continuous layer having a desired thickness, such as shown in FIG. 4D.

For example, using embodiments of methods of the present invention described above, an engineered substrate (such as, for example, the intermediate structure 100 shown in FIG. 1A) may be formed to include an exposed seed semiconductor material 106 comprising Ga-polar gallium nitride overlying the base substrate 104 comprising a sapphire substrate. The intermediate semiconductor material 106 may be used as a seed material to grow an epitaxial Ga-polar indium gallium nitride, $In_{0.8}Ga_{0.92}N$, semiconductor material 110 thereon. The epitaxial Ga-polar indium gallium nitride, $In_{0.8}Ga_{0.92}N$, may be wafer-bonded to a compliant metal overlying the support material 122 comprising an another sapphire substrate (see FIG. 1B). A portion of the epitaxial indium gallium nitride, $In_{0.8}Ga_{0.92}N$, may be detached from the intermediate semiconductor material 106 using the SMART CUT® process so that epitaxial N-polar indium gallium nitride, $In_{0.8}Ga_{0.92}N$, remains on the another sapphire substrate. A mask material is applied and patterned to overlie regions of the epitaxial N-polar indium gallium nitride, $In_{0.8}Ga_{0.92}N$, where it is desired to form structures. A dry etching process (that is, a plasma etching process) may be performed to remove portions of the epitaxial N-polar indium gallium nitride, $In_{0.8}Ga_{0.92}N$, and the compliant metal selective to the mask material. Remaining portions of the mask material may be removed after formation of the indium gallium nitride, $In_{0.8}Ga_{0.92}N$, structures. The semiconductor structure may be thermally treated at a temperature sufficient to deform the compliant metal causing relaxation of the N-polar indium gallium nitride, $In_{0.8}Ga_{0.92}N$, in the structures. Thereafter, an ELO process may be performed to laterally grow indium gallium nitride until a continuous layer of indium gallium nitride is formed to the desired thickness.

As another example, using embodiments of methods of the present invention described above, an engineered substrate (such as, for example, the intermediate structure 100 shown in FIG. 1A) may be formed to include an exposed seed semiconductor material 106 comprising N-polar indium gallium nitride ($In_{0.08}Ga_{0.92}$) overlying the base substrate 104 comprising a sapphire substrate. N-polar indium gallium nitride may be formed by deposition over a growth substrate (not shown) of Ga-polar gallium nitride followed by deposition of Ga-polar indium gallium nitride (e.g., $In_{0.08}Ga_{0.92}$). The exposed surface of the indium gallium nitride may then be subjected to ion-implantation utilizing the SMART CUT® process to form an ion implant layer in the underlying Ga-polar gallium nitride. The exposed Ga-polar indium gallium nitride may then be bonded to the sacrificial substrate 102 utilizing the optional dielectric material 108 and the resulting structure may be subjected to an external force, e.g., mechanical, chemical or thermal, to detach the growth substrate from the indium gallium nitride material. Due to the bonding process the polarity of the indium gallium nitride is inverted, producing the desired N-polar indium gallium nitride upon sacrificial substrate 102. Any remaining portion of gallium nitride may subsequently be removed by etching and/or polishing process to expose the N-polar indium gallium nitride upon sacrificial substrate 102. The epitaxial N-polar indium gallium nitride, $In_{0.8}Ga_{0.92}N$, may be wafer-bonded to a compliant metal overlying the support material 122 comprising an another sapphire substrate (see FIG. 1B). A portion of the epitaxial indium gallium nitride, $In_{0.8}Ga_{0.92}N$, may be detached from the sacrificial substrate 102 using a laser lift-off process so that epitaxial Ga-polar indium gallium nitride, $In_{0.8}Ga_{0.92}N$, remains on the another sapphire substrate. A mask material is applied and patterned to overlie regions of the epitaxial Ga-polar indium gallium nitride, $In_{0.8}Ga_{0.92}N$, where it is desired to form structures. A dry etching process (that is, a plasma etching process) may be performed to remove portions of the epitaxial Ga-polar indium gallium nitride, $In_{0.8}Ga_{0.92}N$, and the compliant metal selective to the mask material. Remaining portions of the mask material may be removed after formation of the indium gallium nitride, $In_{0.8}Ga_{0.92}N$, structures. The semiconductor structure may be thermally treated at a temperature sufficient to deform the compliant metal causing relaxation of the Ga-polar indium gallium nitride, $In_{0.8}Ga_{0.92}N$, in the structures. Thereafter, an ELO process may be performed to laterally grow indium gallium nitride until a continuous layer of indium gallium nitride is formed to the desired thickness.

As another example, an engineered substrate (such as, for example, the intermediate structure 100 shown in FIG. 1A) may be formed to include an exposed intermediate semiconductor material 106 comprising Ga-polar gallium nitride overlying a sapphire substrate. The intermediate semiconductor material 106 may be attached to a second sapphire substrate using a conventional wafer-bonding process and may be removed using a conventional laser lift-off process so that the intermediate semiconductor material 106 comprises N-polar gallium nitride. An epitaxial N-polar indium gallium nitride, $In_{0.8}Ga_{0.92}N$, may be formed over the intermediate semiconductor material 106, with the intermediate semiconductor material 106 acting as a seed material. A mask material may be formed and patterned over the epitaxial N-polar indium gallium nitride, $In_{0.8}Ga_{0.92}N$. A dry etching process may be performed to remove portions of the epitaxial N-polar indium gallium nitride, $In_{0.8}Ga_{0.92}N$, exposed through the mask material and the intermediate semiconductor material 106, forming structures 126, comprising N-polar indium gallium nitride, $In_{0.8}Ga_{0.92}N$. After formation of the structures 126, the remaining portions of the mask material 123 may be removed and the semiconductor structure 160 may be thermally treated at a temperature sufficient to deform the compliant metal, causing relaxation of the N-polar indium gallium nitride, $In_{0.8}Ga_{0.92}N$, in the structures 126. An ELO process may be performed to laterally grow the N-polar indium gallium nitride, $In_{0.9}Ga_{0.1}N$, until a continuous semiconductor material is formed, as described with respect to FIG. 3C. Ion implantation may be performed to a desired depth to define an ion implant layer 112, as described with respect to FIG. 1A. The implanted N-polar indium gallium nitride, $In_{0.8}Ga_{0.92}N$, may be wafer-bonded to a third sapphire substrate and separated from the second sapphire substrate along a zone of weakness defined by the ion implant layer 112. The ion implantation process and removal process may be repeated to form a desired number of composite substrates, each having a desired thickness of N-polar indium gallium nitride, $In_{0.8}Ga_{0.92}N$.

Although embodiments of the present invention have been primarily described herein with reference to semiconductor materials comprising indium gallium nitride, the present invention is not so limited, and embodiments of the present invention may be used to provide semiconductor materials comprising other III-nitride materials, other III-V type semiconductor materials, or other semiconductor materials (such as II-VI type semiconductor materials, silicon, and germanium).

Additional non-limiting example embodiments of the invention are described below.

Embodiment 1

A method of fabricating a semiconductor structure, comprising: forming a metal material over a III-V type semiconductor material and deforming the metal material to relax the III-V type semiconductor material Embodiment 2

The method of Embodiment 1, wherein deforming the metal material to relax the III-V type semiconductor material comprises deforming the metal material to reduce compressive strain in a III-V type semiconductor material comprising indium gallium nitride.

Embodiment 3

The method of Embodiment 1, wherein deforming the metal material to relax the III-V type semiconductor material comprises deforming the metal material to reduce tensile strain in a III-V type semiconductor material comprising aluminum gallium nitride.

Embodiment 4

The method of any one of Embodiments 1 through 3, wherein deforming the metal material to relax the III-V type semiconductor material comprises heating the metal material.

Embodiment 5

The method of any one of Embodiments 1 through 4, deforming the metal material to relax the III-V type semiconductor material comprises heating hafnium or an alloy thereof to a temperature of greater than or equal to about 400° C.

Embodiment 6

The method of any one of Embodiments 1 through 5, wherein deforming the metal material to relax the III-V type semiconductor material comprises heating zirconium or an alloy thereof to a temperature of greater than or equal to about 400° C.

Embodiment 7

The method of any one of Embodiments 1 through 6, wherein deforming the metal material to relax the III-V type semiconductor material comprises depositing another semiconductor material over the III-V type semiconductor material at a temperature sufficient to alter a ductility of the metal material.

Embodiment 8

A method of fabricating a semiconductor structure, comprising: removing a portion of each of a semiconductor material and a metal material overlying a substrate to form a plurality of openings; heating the metal material to alter a ductility thereof; depositing another semiconductor material over the remaining portions of the semiconductor material; and removing a portion of the metal material from between each of the remaining portions of the semiconductor material.

Embodiment 9

The method of Embodiment 8, wherein removing a portion of each of a semiconductor material and a metal material overlying a substrate to form a plurality of openings comprises forming the plurality of openings to extend through the semiconductor material and partially into the metal material Embodiment 10

The method of Embodiment 8 or Embodiment 9, heating the metal material to alter a ductility thereof occurs simultaneously with depositing another semiconductor material over the remaining portions of the semiconductor material.

Embodiment 11

The method of any one of Embodiments 8 through 10, heating the metal material to alter a ductility thereof comprises deforming a metal material comprising at least one of hafnium and zirconium.

Embodiment 12

The method of any one of Embodiments 8 through 11, further comprising heating the metal material to alter a ductility thereof after removing the portion of the metal material between each of the remaining portions of the semiconductor material.

Embodiment 13

A method of fabricating a semiconductor structure, comprising: forming a plurality of openings extending through a semiconductor material and at least partially through a metal material, the semiconductor material overlying the metal material on a substrate; altering a ductility of the metal material to relax a remaining portion of the semiconductor material; and depositing another semiconductor material over the relaxed portion of the semiconductor material.

Embodiment 14

The method of Embodiment 13, wherein forming a plurality of openings extending through the semiconductor material and at least partially through the metal material comprises forming the plurality of openings extending through indium gallium nitride and at least partially through at least one of hafnium and zirconium.

Embodiment 15

The method of Embodiment 13 or Embodiment 14, wherein altering a ductility of the metal material comprises heating the another semiconductor material.

Embodiment 16

A method of fabricating a semiconductor structure, comprising: removing a portion of each of a metal material and a semiconductor material overlying the metal material to form a plurality of openings therein; altering a ductility of the metal material to relax remaining portions of the semiconductor material; forming a sacrificial material over two or more remaining portions of the semiconductor material and a region of the metal material exposed therebetween; removing a portion of the sacrificial material to expose a surface of the remaining portions of the semiconductor material; and forming another semiconductor material laterally over the sacrificial material using the remaining portions of the semiconductor material as a seed material.

Embodiment 17

The method of Embodiment 16, wherein removing a portion of each of a metal material and a semiconductor material overlying the metal material comprises forming the plurality of openings extending though the semiconductor material and only partially into the metal material.

Embodiment 18

The intermediate structure of Embodiment 16 or Embodiment 17, wherein altering a ductility of the metal material comprises heating the metal material to a temperature sufficient to increase a ductility thereof.

Embodiment 19

The intermediate structure of any one of Embodiments 16 through 18, wherein altering a ductility of the metal material comprises deforming the metal material to form a substantially planar upper surface thereon.

Embodiment 20

A method of forming an engineered substrate, comprising: forming an epitaxial III-V type semiconductor material over a metal overlying a substrate and exposing the metal to a temperature sufficient to increase a ductility thereof.

Embodiment 21

The method of Embodiment 20, wherein exposing the metal to a temperature sufficient to increase a ductility thereof comprises exposing the metal to a temperature sufficient to increase a ductility thereof to reduce tensile strain in the epitaxial III-V type semiconductor material comprising aluminum gallium nitride.

Embodiment 22

The method of Embodiment 20 or Embodiment 21, wherein exposing the metal to a temperature sufficient to increase a ductility thereof comprises exposing the metal to a temperature sufficient to increase the ductility thereof to reduce compressive strain in the epitaxial III-V type semiconductor material comprising indium gallium nitride.

Embodiment 23

A semiconductor structure formed during fabrication of an engineered substrate, the intermediate structure comprising a III-V type semiconductor on a metal material overlying a base substrate, the metal exhibiting a ductility sufficient to provide redistribution of the metal material.

Embodiment 24

A semiconductor structure, comprising: a metal material formed over a base substrate; and an at least partially relaxed III-V type semiconductor material disposed over the metal material.

Embodiment 25

The semiconductor structure of Embodiment 24, wherein the at least partially relaxed III-V type semiconductor material comprises a plurality of at least partially relaxed structures of the III-V type semiconductor material disposed over the metal material.

Embodiment 26

The semiconductor structure of Embodiment 24 or Embodiment 25, wherein the metal material comprises at least one of hafnium, zirconium, yttrium, and a metallic glass.

Embodiment 27

The semiconductor structure of any one of Embodiments 24 through 26, wherein the at least partially relaxed III-V type semiconductor material comprises at least partially relaxed indium gallium nitride.

Embodiment 28

The semiconductor structure of any one of Embodiments 24 through 27, further comprising a semiconductor material disposed over the at least partially relaxed III-V type semiconductor material, wherein the semiconductor material comprises a lattice structure matching a lattice structure of the at least partially relaxed III-V type semiconductor material.

The example embodiments of the invention described above do not limit the scope of the invention, since these embodiments are merely examples of embodiments of the invention, which is defined by the scope of the appended claims and their legal equivalents. Any equivalent embodiments are intended to be within the scope of this invention. Indeed, various modifications of the invention, in addition to those shown and described herein, such as alternate useful combinations of the elements described, will become apparent to those skilled in the art from the description. In other words, one or more features of one example embodiment described herein may be combined with one or more features of another example embodiment described herein to provide additional embodiments of the invention. Such modifications and embodiments are also intended to fall within the scope of the appended claims.

What is claimed is:

1. A semiconductor structure, comprising:
a ductile metal formed over a base substrate, wherein the ductile metal comprises at least one of hafnium, zirconium, yttrium, an alloy of one or more such metals, and a metallic glass; and
one or more at least substantially relaxed islands of III-V type semiconductor material disposed over the ductile metal.

2. The semiconductor structure of claim 1, wherein the ductile metal exhibits a ductility β defined by:

$$\beta = \frac{\sigma_{11}^T}{|\sigma_{11}^C|},$$

wherein $\sigma_{11}^T$ is the yield level for uniaxial tension and $\sigma_{11}^C$ the yield level for uniaxial compression, the ductility β being greater than 0.50.

3. The semiconductor structure of claim 2, wherein the ductility β is at least 0.90.

4. The semiconductor structure of claim 3, wherein the ductility β is at least 0.95.

5. The semiconductor structure of claim 1, wherein the ductile metal exhibits a yield strength of about 400 MPa or less at a temperature of about 1,000° C. or less.

6. The semiconductor structure of claim 5, wherein the yield strength is about 300 MPa or less at a temperature of about 1,000° C. or less.

7. The semiconductor structure of claim 1, wherein the ductile metal exhibits a bulk modulus of about 150 GPa or less at a temperature of about 1,000° C. or less.

8. The semiconductor structure of claim 7, wherein the bulk modulus is about 110 GPa or less at a temperature of about 1,000° C. or less.

9. The semiconductor structure of claim 1, wherein the ductile metal exhibits an electrical resistivity of less than about 50 μΩcm.

10. The semiconductor structure of claim 1, wherein the ductile metal exhibits a thermal conductivity of at least about 15 Wm$^{-1}$K$^{-1}$.

11. The semiconductor structure of claim 10, wherein the ductile metal exhibits a thermal conductivity of at least about 20 Wm$^{-1}$K$^{-1}$.

12. The semiconductor structure of claim 1, wherein the ductile metal is plastically deformed.

13. The semiconductor structure of claim 1, wherein the one or more at least substantially relaxed islands of III-V type semiconductor material comprises a plurality of at least substantially relaxed islands of the III-V type semiconductor material disposed over the metal material.

14. The semiconductor structure of claim 1, wherein the III-V type semiconductor material comprises indium gallium nitride.

15. The semiconductor structure of claim 1, further comprising a semiconductor material disposed over the one or more at least substantially relaxed islands of III-V type semiconductor material, wherein the semiconductor material comprises a lattice structure matching a lattice structure of the III-V type semiconductor material.

16. The semiconductor structure of claim 1, wherein the base substrate comprises a material selected from the group consisting of sapphire, silicon, silicon carbide, a III-V type material, quartz, and fused silica glass.

17. The semiconductor structure of claim 1, wherein the base substrate comprises a conductive material selected from a doped semiconductor material and a metal.

18. The semiconductor structure of claim 1, wherein the base substrate includes one or more device structures.

19. The semiconductor structure of claim 18, wherein the one or more device structures includes one or more of transistors, diodes, resistors, thyristors, rectifiers, conductive lines, conductive vias, conductive pads, and conductive through wafer interconnects.

20. The semiconductor structure of claim 1, wherein the at least substantially relaxed III-V type semiconductor material has a selected degree of lattice strain.

21. A semiconductor structure formed during fabrication of an engineered substrate, the semiconductor structure comprising one or more at least substantially relaxed islands of III-V type semiconductor material on a ductile metal overlying a base substrate, the ductile metal exhibiting a ductility sufficient to provide redistribution of the ductile metal during strain relaxation of the one or more at least substantially relaxed islands of III-V type semiconductor material on the ductile metal, wherein the ductile metal comprises at least one of hafnium, zirconium, yttrium, an alloy of one or more such metals, and a metallic glass.

22. The semiconductor structure of claim 21, wherein the one or more at least substantially relaxed islands of III-V type semiconductor material have a substantially uniform average lattice parameter.

23. The semiconductor structure of claim 21, wherein the ductile metal is plastically deformed.

24. The semiconductor structure of claim 21, wherein each of the one or more at least substantially relaxed islands of III-V type semiconductor material is entirely separated from the base substrate by the ductile metal.

* * * * *